(12) United States Patent
Lee et al.

(10) Patent No.: US 7,183,224 B2
(45) Date of Patent: Feb. 27, 2007

(54) LIFTOFF PROCESS FOR THIN PHOTORESIST

(75) Inventors: Kim Y. Lee, Fremont, CA (US); Chun-Ming Wang, Fremont, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 540 days.

(21) Appl. No.: 10/631,579

(22) Filed: Jul. 30, 2003

(65) Prior Publication Data

US 2005/0068672 A1    Mar. 31, 2005

(51) Int. Cl.
*H01L 21/302* (2006.01)
*H01L 21/461* (2006.01)

(52) U.S. Cl. ............... 438/736; 438/719; 257/E21.025

(58) Field of Classification Search ............... 438/736, 438/719; 257/E21.025, E21.023, E21.034, 257/E21.035
See application file for complete search history.

(56) References Cited

U.S. PATENT DOCUMENTS

| | | | |
|---|---|---|---|
| 5,277,749 A | 1/1994 | Griffith et al. ............... 156/643 |
| 5,695,656 A * | 12/1997 | Park et al. ..................... 216/22 |
| 5,702,868 A | 12/1997 | Kellam et al. ............... 430/312 |
| 6,391,472 B1 * | 5/2002 | Lamb et al. ................. 428/624 |
| 6,493,926 B2 | 12/2002 | Han et al. ................. 29/603.14 |
| 6,604,275 B1 * | 8/2003 | Mino et al. ............... 29/603.15 |
| 6,842,308 B1 * | 1/2005 | Pust et al. ............... 360/234.7 |
| 6,898,057 B2 * | 5/2005 | Okai et al. ................... 360/126 |
| 2004/0018451 A1* | 1/2004 | Choi ........................... 430/313 |
| 2004/0051173 A1* | 3/2004 | Koh et al. ................... 257/728 |

\* cited by examiner

*Primary Examiner*—Caridad Everhart
(74) *Attorney, Agent, or Firm*—Zilka-Kotab, PC

(57) ABSTRACT

A method is invented for processing a thin-film head/semiconductor wafer. A layer of polymer is applied onto a wafer. A layer of dielectric material is added above the polymer layer. A layer of photoresist is added above the dielectric layer. The photoresist layer is patterned using a photolithography process. Exposed portions of the dielectric layer are removed. Exposed portions of the polymer layer are removed. Exposed portions of the wafer are removed. The polymer layer and any material thereabove is removed after hard bias/leads deposition.

23 Claims, 6 Drawing Sheets

US 7,183,224 B2

LIFTOFF PROCESS FOR THIN PHOTORESIST

FIELD OF THE INVENTION

The present invention relates to semiconductor and thin film head processing, and more particularly, this invention relates to a novel process for wafer processing with thin photoresist.

BACKGROUND OF THE INVENTION

Thin film head components such as sensors are created by wafer processing. Typically, a layer of photoresist is added to define the width of the component positioned underneath, and exposed material is removed by various processes. As components become smaller, the lithographic patterns must also become smaller yet must maintain a high resolution to properly form the components.

To achieve the high resolutions required for new processes, 193 nm lithography is typically used. However, 193 nm photoresist is very soft, typically softer than the underlayer. If reactive ion etching (RIE) is used, the topography of the photoresist pattern tends to be destroyed because the photoresist etches away faster than the underlayer. If edges of the photoresist are reduced, i.e., the resolution is degraded, the edges of the component will be removed, resulting in a deformed component. Further, if too little photoresist remains, upon ion milling, the photoresist will completely erode away and the surface of the component sought to be protected will be damaged.

Prior art attempts to overcome the problem of photoresist erosion used thicker layers of photoresist. However, the photoresist tended to fall over during subsequent processing. It was found that only an aspect ratio of about 3 to 1 photoresist height/width or less was stable enough for further processing.

The requirement that the photoresist be kept thin created another problem. Thin layers of photoresist, made thinner by subsequent processing, are hard to remove from the wafer. For example, if the processing parameters require printing of a 50 nm wide photoresist pattern, the thickness of the photoresist is only 150 nm. After processing, the photoresist is very thin, and causes the problems mentioned above.

What is needed is a way to achieve high resolution with a thin photoresist pattern. What is also needed is a way to stop the RIE from damaging the component sought to be protected. What is further needed is a way to ease the liftoff process.

SUMMARY OF THE INVENTION

The present invention overcomes the drawbacks and limitations described above by providing a method for processing a thin film head/semiconductor wafer. A layer of polymer is applied onto a wafer. The polymer can then be cured to harden it. A layer of dielectric material is added above the polymer layer. A layer of photoresist is added above the dielectric layer. The photoresist layer is patterned using a photolithography process. Exposed portions of the dielectric layer are removed, preferably using reactive ion etching. Exposed portions of the polymer layer are removed, preferably using plasma etching. Exposed portions of the wafer are removed, preferably by milling. The polymer layer and any material thereabove is removed, preferably using a liftoff process. The polymer can be weakened by a chemical applied during the liftoff process.

In one embodiment, a thickness of the layer of photoresist in a direction perpendicular to the interface of the layer of photoresist and layer of polymer is less than about 300 nanometers, preferably less than about 200 nanometers. Also preferably, a ratio of the thickness of the patterned layer of photoresist to a width thereof measured between voids created therein by the photolithography process is less than about 3.5 to 1.

A thickness of the polymer layer in a direction perpendicular to the interface of the layer of photoresist and layer of polymer is preferably about half a thickness of the layer of photoresist measured in the same direction. Also, a thickness of the dielectric layer in a direction perpendicular to the interface of the layer of photoresist and layer of polymer is preferably at least about one third a thickness of the layer of photoresist measured in the same direction.

Additional materials can be added prior to lifting off the polymer layer to form, for example, additional components of a magnetic sensor (e.g., hard bias/lead) or other electronic component.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

The present invention uses a tri-layer structure that employs an image transfer method to enhance the aspect ratio of protective layers as well as achieve high resolution. The tri-layer structure includes a polymer underlayer, a dielectric layer, and a layer of thin photoresist. The underlayer maintains the topography and facilitates the liftoff process, while the thin photoresist provides high resolution.

Figure 1:
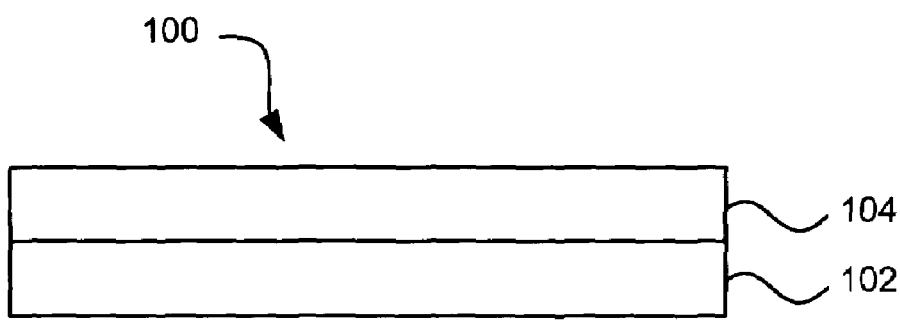
FIG. 1 is a partial cross sectional view of a wafer with a polymer underlayer applied.

According to the preferred method, a wafer 102 including electronic/magnetic components is coated with a polymer underlayer 104, creating the structure 100 shown in FIG. 1. The polymer can be added using a spin on process. Then the structure is baked to cure the polymer underlayer 104. One illustrative material from which the polymer underlayer 104 may be formed is Barli, sold by AZ Electronic Materials, 70 Meister Avenue, Somerville, N.J. 08876. Another exemplary material is Duramide. In this example, the thickness of the underlayer 104 is preferably about 50–100 nm.

Figure 2:
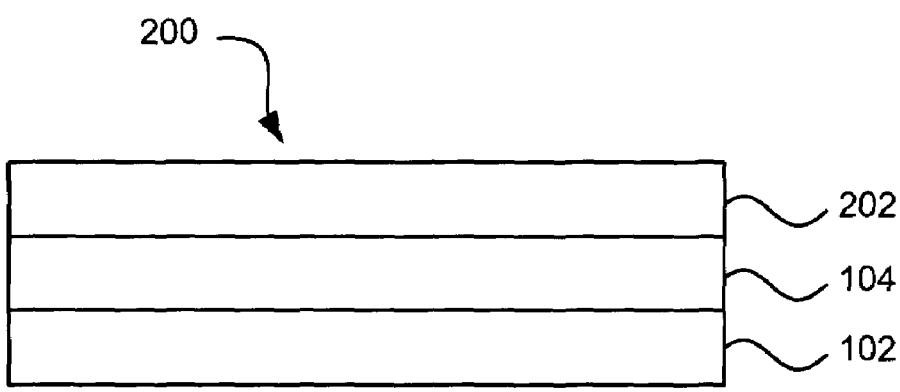
FIG. 2 is a partial cross section of the structure of FIG. 1 upon addition of a dielectric layer.

A layer of dielectric material 202 is added to the structure 100 of FIG. 1 using any suitable process, such as chemical vapor deposition (CVD), spin-on glass or sputtering. The resulting structure 200 is shown in FIG. 2. In this example, the thickness of the dielectric layer 202 is preferably about 30–60 nm. Note that the polymer underlayer 104 acts as a relief layer for eventual liftoff of the dielectric layer 202, and the hard bias and lead layers 802/804. Otherwise, if the dielectric layer 202 were placed directly on wafer 102, some residual material would probably remain on the wafer 102.

Figure 3:
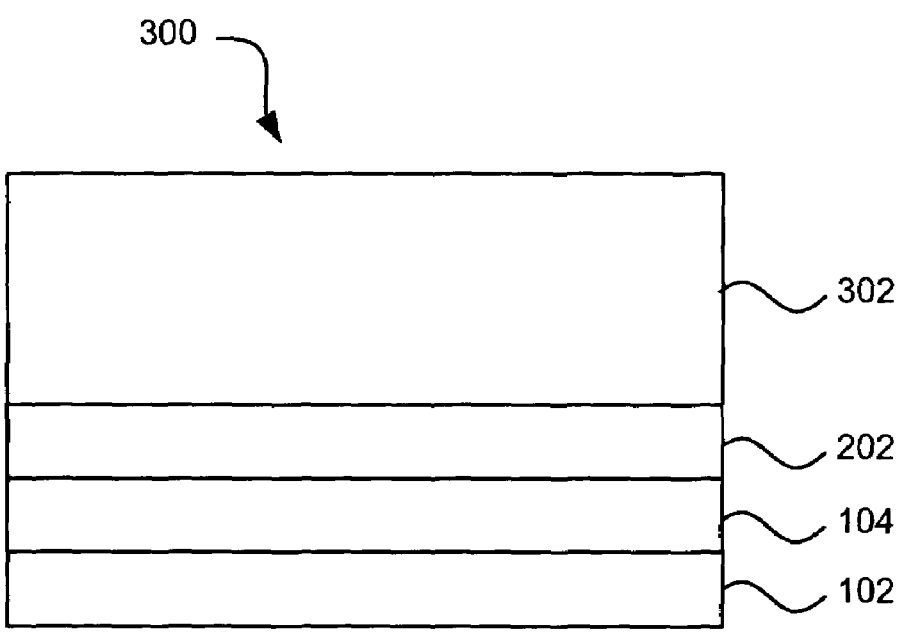
FIG. 3 is a partial cross section of the structure of FIG. 2 upon addition of a layer of photoresist.

A layer of photoresist 302 is added to the structure of FIG. 2, resulting in the structure 300 shown in FIG. 3. A standard photolithographic process is used to pattern the layer of photoresist 302 such that the remaining photoresist overlays the components, thereby defining the boundaries of the components to be formed from the wafer 102. The patterned layer of photoresist 302 is shown on the structure 400 of FIG. 4. The width W of the photoresist 302 in this example is preferably about 50–100 nm, while the thickness T is about 150–300 nm (about 3 times the width of 50–100 nm), but can be less than 150 nm. Thus, the aspect ratio of less than about 3 to 1 (T/W) is maintained.

Figure 4:
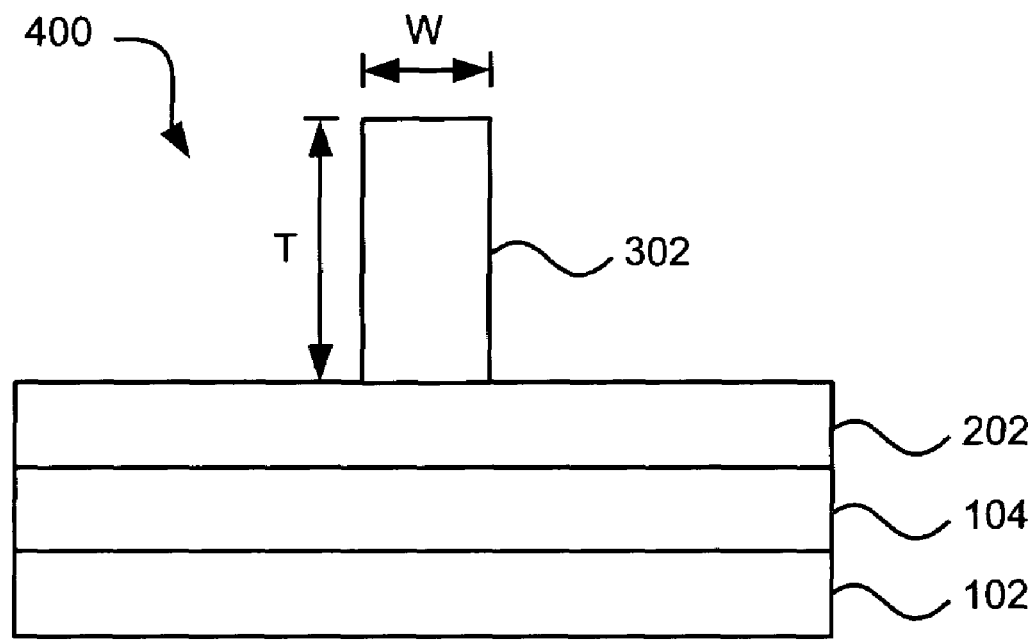
FIG. 4 is a partial cross section of the structure of FIG. 3 upon patterning of the layer of photoresist.
Figure 5:
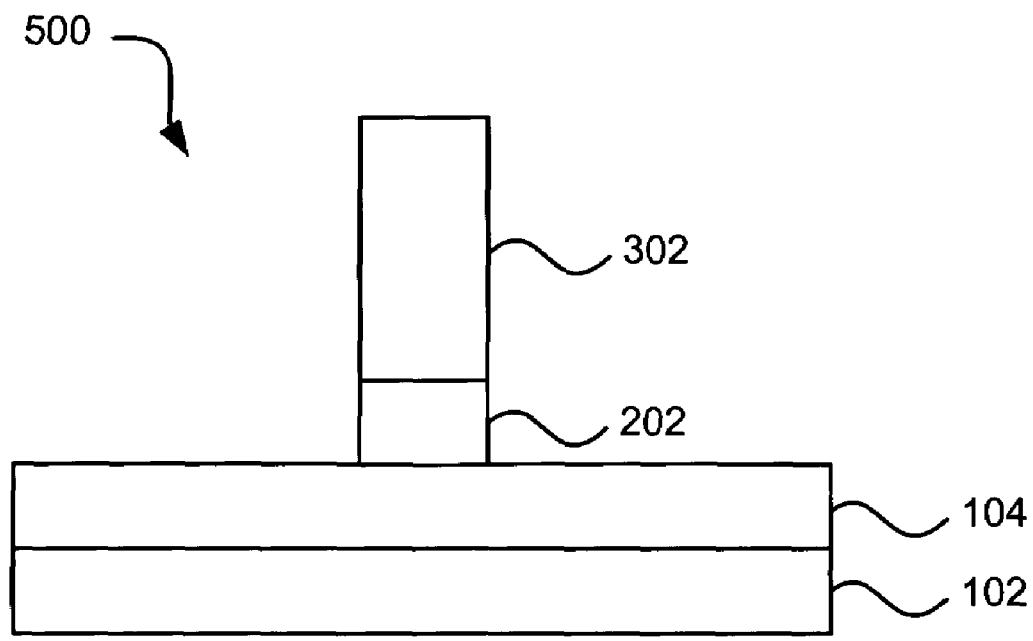
FIG. 5 is a partial cross section of the structure of FIG. 4 upon removing exposed portions of the dielectric layer.

The structure 400 of FIG. 4 is etched via RIE with $CF_4$, $CHF_3$, etc. to remove the exposed portions of the dielectric layer 202, creating the structure 500 shown in FIG. 5. Note in FIG. 5 that the layer of photoresist 302 has been partially eroded during RIE.

Figure 6:
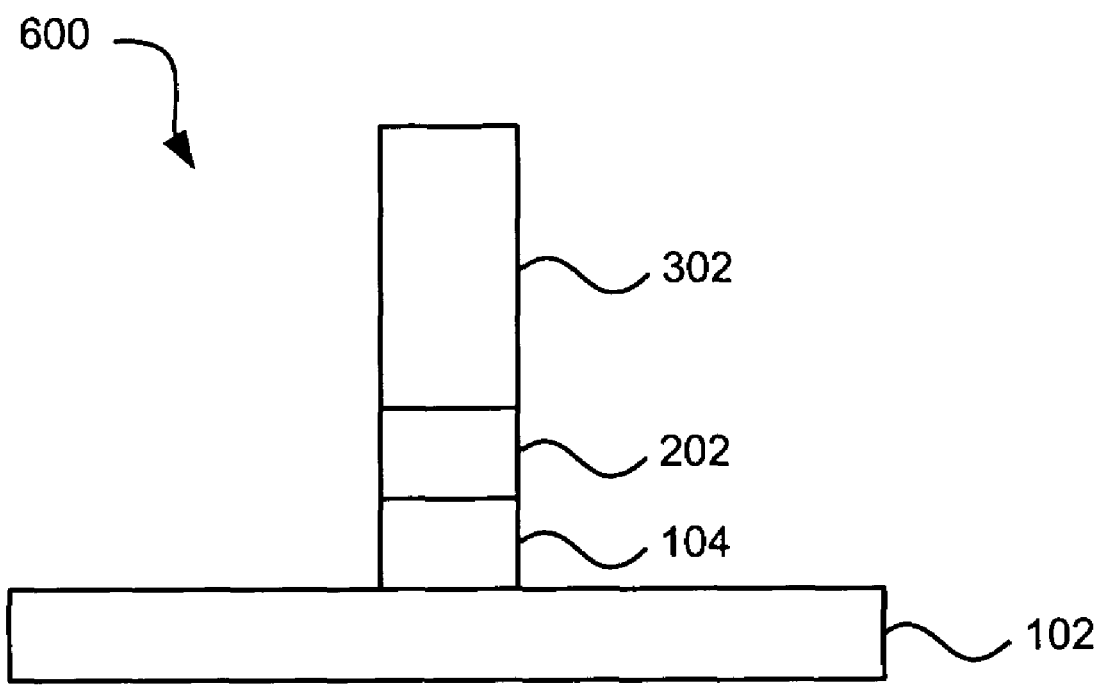
FIG. 6 is a partial cross section of the structure of FIG. 5 upon removing exposed portions of the polymer layer.

Next, $O_2$ plasma etching is performed to remove the exposed portions of the polymer underlayer 104, resulting in the structure 600 shown in FIG. 6.

Figure 7:
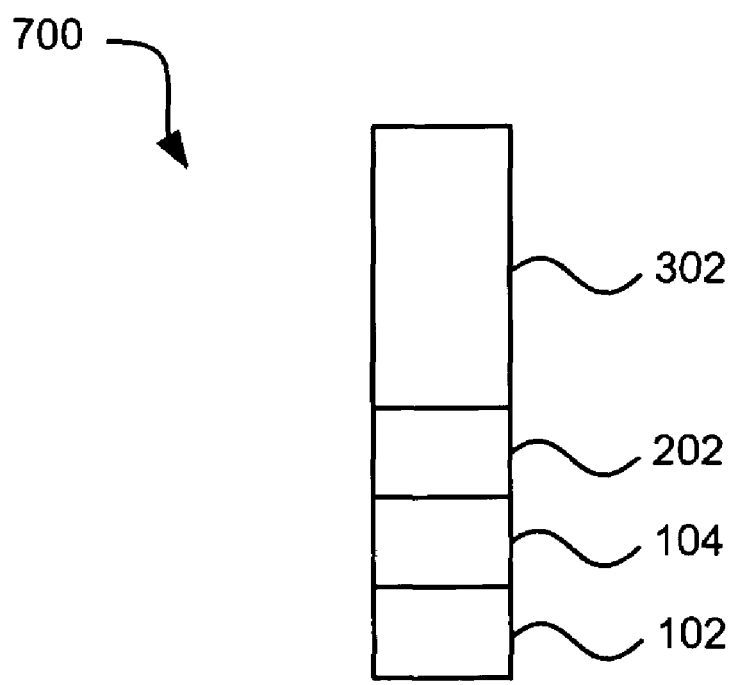
FIG. 7 is a partial cross section of the structure of FIG. 6 upon removing exposed portions of the wafer.

The structure 600 of FIG. 6 is ion-milled to remove the exposed portions of the wafer 102. The resulting structure 700 is shown in FIG. 7. At this point, the layer of photoresist 302 may have been completely eroded away by the processing, but the $O_2$ plasma etching and ion milling do not significantly attack the dielectric layer 202 so the structure under the dielectric layer 202 is protected.

Figure 8:
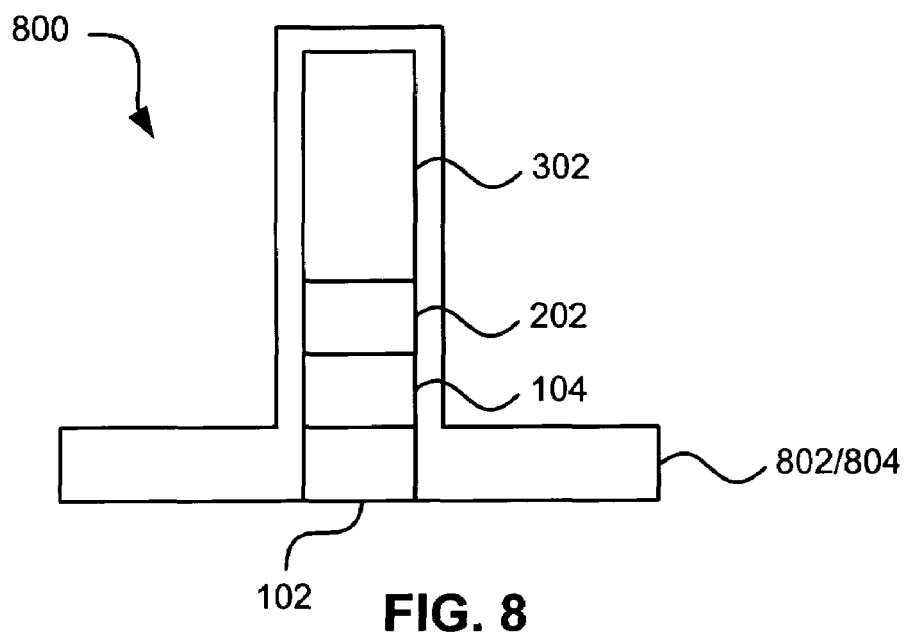
FIG. 8 is a partial cross section of the structure of FIG. 7 upon addition of hard bias and lead material.

Assuming that the component formed from the wafer 102 is a sensor for a magnetic disk head, hard bias layers 802 and then leads 804 are formed, creating the structure 800 shown in FIG. 8.

Figure 9:
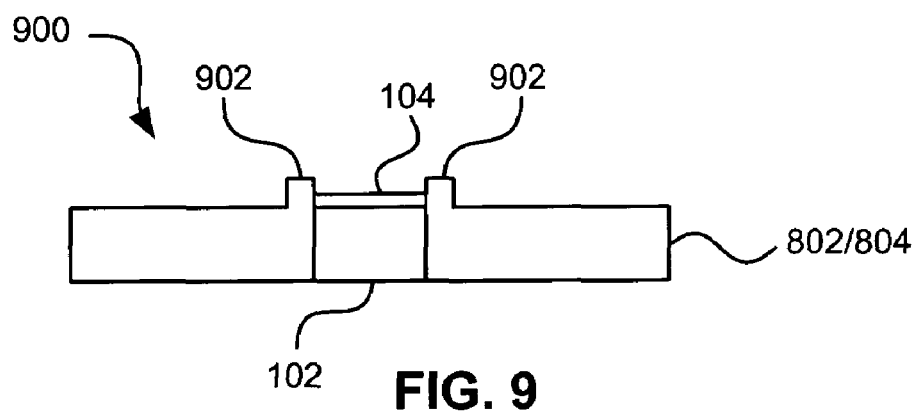
FIG. 9 is a partial cross section of the structure of FIG. 8 upon performing a liftoff process.

Next, a liftoff process is performed to remove some or all the polymer underlayer 104 and any material remaining above the polymer underlayer 104. The resulting structure 900 is shown in FIG. 9. The liftoff process can include application of a chemical that weakens the polymer underlayer 104. For example, N-methlypyrrolidone (NMP) can be used to dissolve the polymer underlayer 104. Note that the hard bias and lead materials that attach to the edge of the stack are porous, which allows the NMP to penetrate therethrough to attack the polymer underlayer 104. Then the polymer underlayer 104 and any layers under it are removed by a conventional liftoff procedure.

Figure 10:
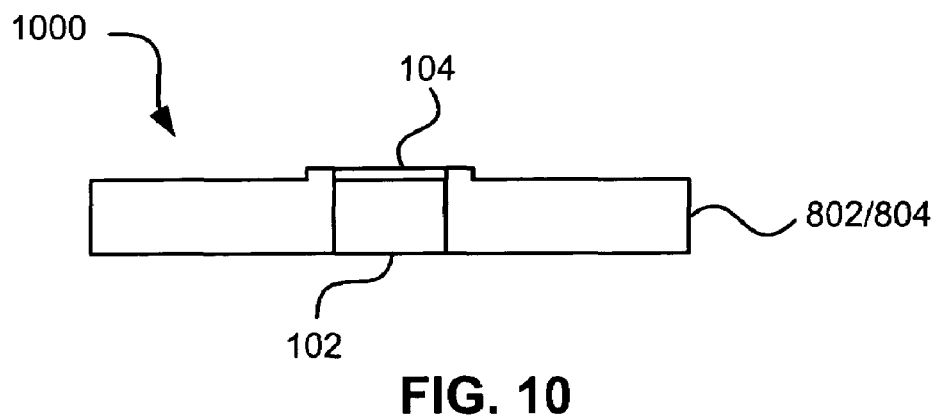
FIG. 10 is a partial cross section of the structure of FIG. 9 upon performing a chemical mechanical polishing to remove fencing from the structure.
Figure 11:
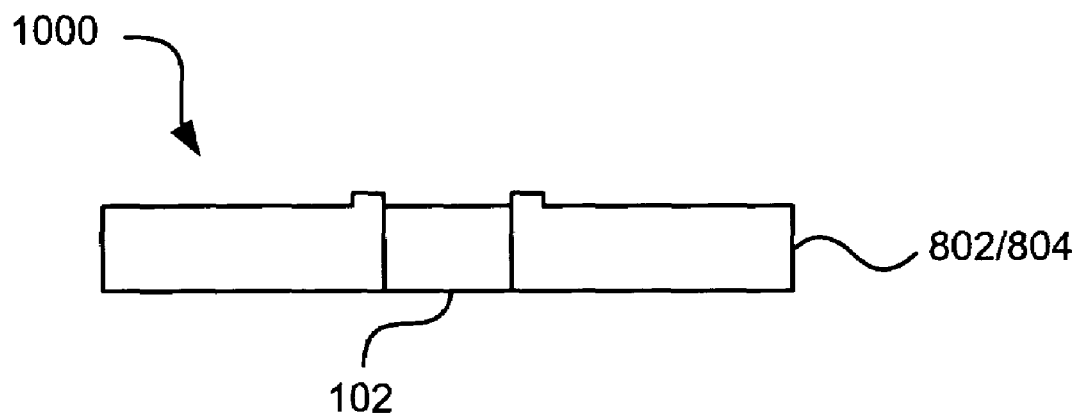
FIG. 11 is a partial cross section of the structure of FIG. 10 upon performing an additional processing step to remove any residual polymer material.

Note that some fencing 902 of the lead and hard bias material may remain. As optional steps, conventional chemical mechanical polishing (CMP) can be performed to reduce the fencing 902. See FIG. 10. Then $O_2$ RIE can be performed to remove any residual polymer material. See FIG. 11. If a carbon layer (not shown) is added to protect the magnetic sensor from the CMP, the $O_2$ RIE will also remove the carbon.

In addition to overcoming the limitations imposed by resolution requirements, the methodology embodied in this invention also allows a precisely tailored structure for ion-milling of a semiconductor component such as a GMR sensor. Specifically, the height of the masking structure will determine the wall angle of the milled GMR junction. Particularly pertinent to ultra-contiguous junction (UCJ) heads, an abrupt vertical junction is desirable. This is achieved using a low profile structure to minimize shadowing effect during the ion-milling step. On the other hand, the thickness of the masking structure must be sufficiently tall for successful liftoff. This invention allows the thickness to be precisely tuned for both, simply by pre-defining the polymer underlayer and dielectric thicknesses. This is illustrated in the following description.

Figure 12:
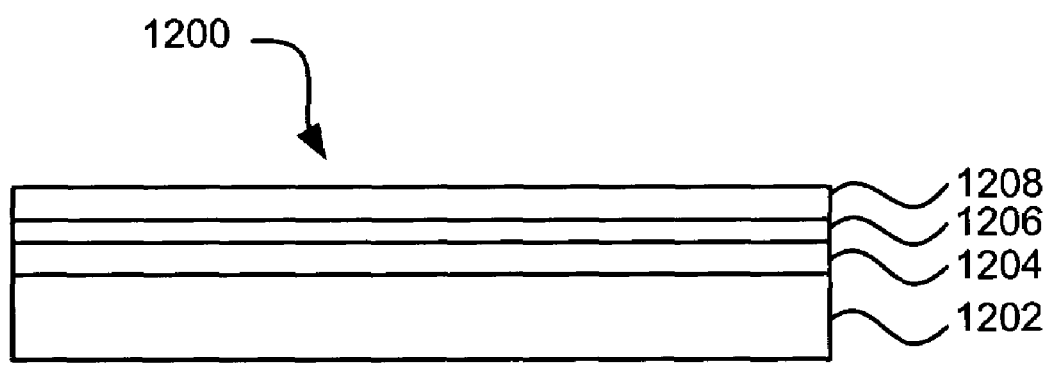
FIG. 12 is a partial cross sectional view of a structure to be processed according to another embodiment.

FIG. 12 illustrates a structure 1200 to be processed. As shown, a polymer underlayer 1204 of a predefined thickness is created above a wafer 1202. A dielectric layer 1206 of a predefined thickness is added above the underlayer 1204. Imaging photoresist 1208 is added above the dielectric layer 1206. The underlayer 1204 provides sufficient height to the dielectric layer 1206 to allow successful liftoff.

Figure 13:
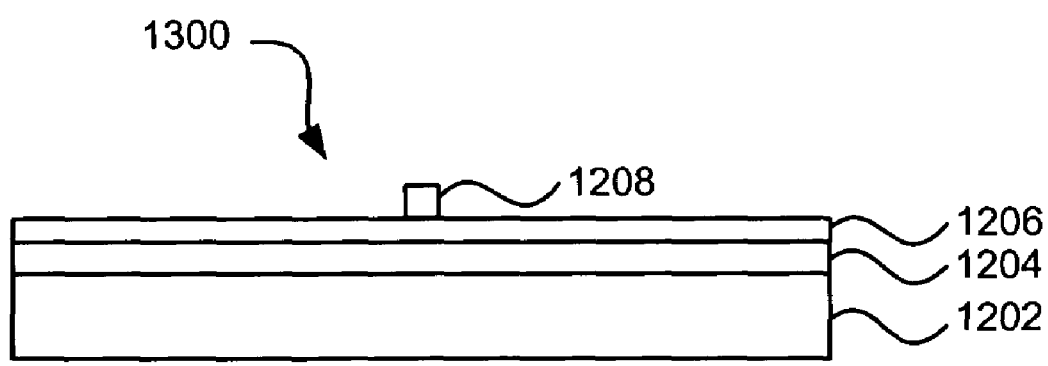
FIG. 13 is a partial cross section of the structure of FIG. 12 upon patterning of the layer of photoresist.
Figure 14:
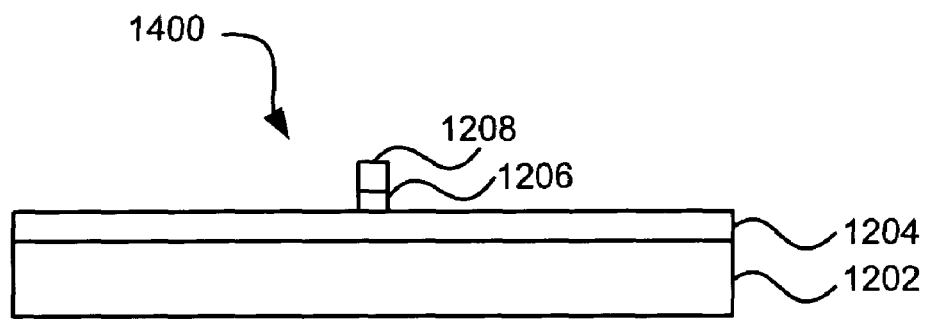
FIG. 14 is a partial cross section of the structure of FIG. 13 upon removing exposed portions of the dielectric layer.

The photoresist 1208 of the structure 1200 of FIG. 12 is exposed and developed, resulting in the structure 1300 shown in FIG. 13. The dielectric layer 1206 is RIEed to create the structure 1400 shown in FIG. 14. Note that the RIE will also typically etch the underlayer 1204 slightly.

Figure 15:
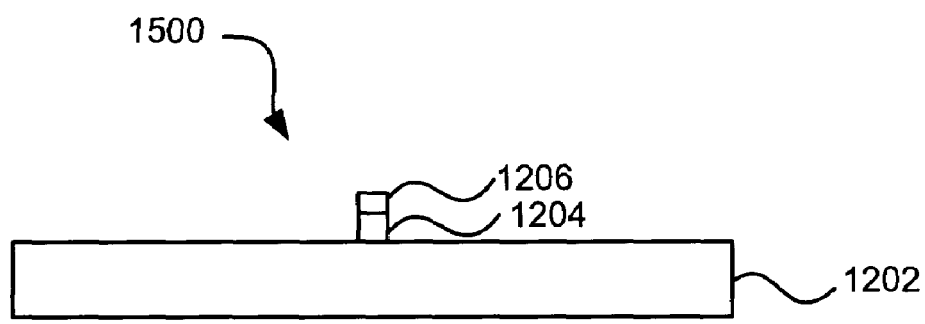
FIG. 15 is a partial cross section of the structure of FIG. 14 upon removing exposed portions of the polymer underlayer.

Referring to the structure 1500 shown in FIG. 15, the underlayer 1204 is RIEed in an oxygen plasma. Since the oxygen RIE step erodes the underlying dielectric layer 1204 at a very slow rate, overetching is performed to remove the top imaging photoresist 1208 completely. This results in a polymer/dielectric stack with a well-defined thickness.

Figure 16:
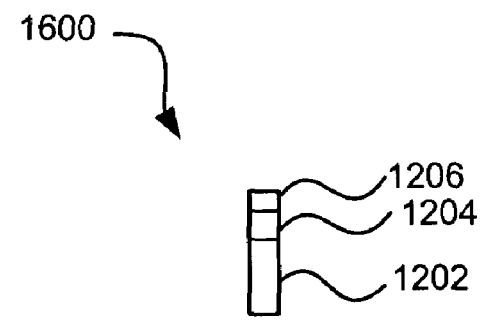
FIG. 16 is a partial cross section of the structure of FIG. 15 upon removing exposed portions of the wafer.

The wafer 1202 is ion milled to create the structure 1600 shown in FIG. 16. As shown, a straight milled angle of the wafer 1202 is achieved because the polymer/dielectric stack forms a low profile mill mask. In this example, the polymer/dielectric stack has a total thickness of about 50 nm. This low profile mask reduces shadowing during ion-milling.

Figure 17:
FIG. 17 is a partial cross section of a UCJ sensor formed by the process of FIGS. 12–16.
Figure 18:
FIG. 18 depicts a non-abrupt junction of a UCJ sensor.

FIG. 17 illustrates the abrupt junction of a UCJ sensor 1700 formed by the process of FIGS. 12–16. For comparison, FIG. 18 depicts a non-abrupt junction of a UCJ sensor 1800 created by shadowing during the ion milling process.

While various embodiments have been described above, it should be understood that they have been presented by way of example only, and not limitation. For example, the structures and methodologies presented herein are generic in their application to all semiconductor devices, including magnetic disk heads. Thus, the breadth and scope of a preferred embodiment should not be limited by any of the above-described exemplary embodiments, but should be defined only in accordance with the following claims and their equivalents.

What is claimed is:

1. A method for processing a semiconductor wafer, comprising:
   applying a layer of polymer onto a wafer;
   adding a layer of dielectric material above the polymer layer;
   adding a layer of photoresist above the dielectric layer;
   patterning the photoresist layer using a photolithography process;
   removing exposed portions of the dielectric layer;
   removing exposed portions of the polymer layer;
   removing exposed portions of the wafer; and
   removing the polymer layer and any material thereabove.

2. The method as recited in claim 1, wherein the polymer layer is removed using a liftoff process, wherein the polymer layer is weakened by a chemical applied during the liftoff process.

3. The method as recited in claim 1, wherein a thickness of the layer of photoresist in a direction perpendicular to the interface of the layer of photoresist and layer of polymer is less than about 300 nanometers.

4. The method as recited in claim 1, wherein a thickness of the layer of photoresist in a direction perpendicular to the interface of the layer of photoresist and layer of polymer is less than about 200 nanometers.

5. The method as recited in claim 1, wherein a thickness of the layer of photoresist in a direction perpenciculur to the interface of the layer of photoresist and layer of polymer is less than about 100 nanometers.

6. The method as recited in claim 1, wherein a ratio of the thickness of the patterned layer of photoresist to a width thereof measured between voids created therein by the photolithography process is less than about 3.5 to 1.

7. The method as recited in claim 1, wherein a thickness of the polymer layer in a direction perpendicular to the interface of the layer of photoresist and layer of polymer is at least about half a thickness of the layer of photoresist measured in the same direction.

8. The method as recited in claim 1, wherein a thickness of the dielectric layer in a direction perpendicular to the interface of the layer of photoresist and layer of polymer is at least about one third a thickness of the layer of photoresist measured in the same direction.

9. The method as recited in claim 1, further comprising adding at least one additional material prior to removing the polymer layer.

10. The method as recited in claim 1, wherein a magnetic sensor is created by the method.

11. The method as recited in claim 1, wherein a thickness of the layer of dielectric and layer of polymer are predefined for reducing shadowing during removal of exposed portions of the wafer by milling.

12. The method as recited in claim 1, further comprising fabricating a magnetic sensor on the wafer prior to applying the layer of polymer onto the wafer.

13. A method for processing a semiconductor wafer, comprising:
   applying a layer of polymer onto a wafer;
   curing the polymer;
   adding a layer of dielectric material above the polymer layer;
   adding a layer of photoresist above the dielectric layer;
   patterning the photoresist layer using a photolithography process;
   removing exposed portions of the dielectric layer using reactive ion etching;
   removing exposed portions of the polymer layer using plasma etching;
   removing exposed portions of the wafer by milling; and
   lifting off the polymer layer and any material thereabove.

14. The method as recited in claim 13, wherein the polymer layer is weakened by a chemical applied during the liftoff.

15. The method as recited in claim 13, wherein a thickness of the layer of photoresist in a direction perpendicular to the interface of the layer of photoresist and layer of polymer is less than about 300 nanometers.

16. The method as recited in claim 13, wherein a thickness of the layer of photoresist in a direction perpendicular to the interface of the layer of photoresiat and layer of polymer is less than about 200 nanometers.

17. The method as recited in claim 13, wherein a thickness of the layer of photoresist in a direction perpendicular to the interface of the layer of photoresist and layer of polymer is less than about 100 nanometers.

18. The method as recited in claim 13, wherein a ratio of the thickness of the patterned layer of photoresist to a width thereof measured between voids created therein by the photolithography process is less than about 3.5 to 1.

19. The method as recited in claim 13, wherein a thickness of the polymer layer in a direction perpendicular to the interface of the layer of photoresist and layer of polymer is at least about half a thickness of the layer of photoresist measured in the same direction.

20. The method as recited in claim 13, wherein a thickness of the dielectric layer in a direction perpendicular to the interface of the layer of photoresist and layer of polymer is at least about one third a thickness of the layer of photoresist measured in the same direction.

21. The method as recited in claim 13, further comprising adding at least one additional material prior to lifting off the polymer layer.

22. The method as recited in claim 13, wherein a thickness of the layer of dielectric and layer of polymer are predefined for reducing shadowing during removal of exposed portions of the wafer by milling.

23. The method as recited in claim 13, further comprising fabricating a magnetic sensor on the wafer prior to applying the layer of polymer onto the wafer.

* * * * *

UNITED STATES PATENT AND TRADEMARK OFFICE
CERTIFICATE OF CORRECTION

PATENT NO. : 7,183,224 B2
APPLICATION NO. : 10/631579
DATED : February 27, 2007
INVENTOR(S) : Lee et al.

Page 1 of 1

It is certified that error appears in the above-identified patent and that said Letters Patent is hereby corrected as shown below:

In the claims:
col. 5, line 33 change "perpencliculur" to --perpendicular--;
col. 6, line 28 change "photoresiat" to --photoresist--.

Signed and Sealed this

Fifteenth Day of May, 2007

JON W. DUDAS
*Director of the United States Patent and Trademark Office*